(12) United States Patent
Jiang

(10) Patent No.: US 6,548,376 B2
(45) Date of Patent: Apr. 15, 2003

(54) METHODS OF THINNING MICROELECTRONIC WORKPIECES

(75) Inventor: Tongbi Jiang, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/944,245

(22) Filed: Aug. 30, 2001

(65) Prior Publication Data

US 2003/0045072 A1 Mar. 6, 2003

(51) Int. Cl.⁷ .............................................. H01L 21/30
(52) U.S. Cl. ...................................... 438/459; 438/108
(58) Field of Search ................................ 438/107–109, 438/118, 620, 613, 624, 240, 724, 597, 459; 257/737, 777

(56) References Cited

U.S. PATENT DOCUMENTS

| | | | |
|---|---|---|---|
| 5,128,831 A | 7/1992 | Fox, III et al. |
| 5,256,599 A | 10/1993 | Asetta et al. |
| 5,273,940 A | 12/1993 | Sanders |
| 5,324,687 A | 6/1994 | Wojnarowski |
| 5,593,927 A | 1/1997 | Farnworth et al. |
| 5,656,552 A | 8/1997 | Hudak et al. |
| 5,891,797 A | 4/1999 | Farrar |
| 5,930,652 A | 7/1999 | Mukerji et al. |
| 5,946,553 A | 8/1999 | Wood et al. |
| 5,986,209 A | 11/1999 | Tandy |
| 5,990,566 A | 11/1999 | Farnworth et al. |
| 6,013,534 A | 1/2000 | Mountain |
| 6,018,249 A | 1/2000 | Akram et al. |
| 6,020,624 A | 2/2000 | Wood et al. |
| 6,020,629 A | 2/2000 | Farnworth et al. |
| 6,028,365 A | 2/2000 | Akram et al. |
| 6,051,878 A | 4/2000 | Akram et al. |
| 6,072,233 A | 6/2000 | Corisis et al. |

(List continued on next page.)

Primary Examiner—David Nelms
Assistant Examiner—Long Tran
(74) Attorney, Agent, or Firm—Perkins Coie LLP

(57) ABSTRACT

Microelectronic device assemblies are provided with reduced-thickness dies. In certain methods of the invention, a die is connected to a mounting surface of a support and the back surface of the die is ground to reduce the die thickness. In certain embodiments, a portion of the mounting surface of the substrate remains exposed, permitting other devices to be electrically coupled directly to the substrate. In other embodiments, a second die is electrically coupled to the ground back surface of the first die via an intermediate layer, enabling a reduced profile stacked die assembly without requiring direct connection to the support.

34 Claims, 5 Drawing Sheets

U.S. PATENT DOCUMENTS

| | | |
|---|---|---|
| 6,072,236 A | 6/2000 | Akram et al. |
| 6,089,920 A | 7/2000 | Farnworth et al. |
| 6,097,087 A | 8/2000 | Farnworth et al. |
| 6,107,122 A | 8/2000 | Wood et al. |
| 6,124,633 A | 9/2000 | Vindasius et al. |
| 6,130,474 A | 10/2000 | Corisis |
| 6,148,509 A | 11/2000 | Schoenfeld et al. |
| 6,150,717 A | 11/2000 | Wood et al. |
| 6,175,149 B1 | 1/2001 | Akram |
| 6,180,527 B1 | 1/2001 | Farnworth et al. |
| 6,184,064 B1 | 2/2001 | Jiang et al. |
| 6,188,232 B1 | 2/2001 | Akram et al. |
| 6,201,304 B1 | 3/2001 | Moden |
| 6,212,767 B1 | 4/2001 | Tandy |
| 6,214,716 B1 | 4/2001 | Akram |
| 6,225,689 B1 | 5/2001 | Moden et al. |
| 6,232,666 B1 | 5/2001 | Corisis et al. |
| 6,235,554 B1 | 5/2001 | Akram et al. |
| 6,239,489 B1 | 5/2001 | Jiang |
| 6,242,931 B1 | 6/2001 | Hembree et al. |
| 6,247,629 B1 | 6/2001 | Jacobson et al. |
| 6,258,623 B1 | 7/2001 | Moden et al. |
| 6,258,626 B1 * | 7/2001 | Wang et al. ............... 257/777 |
| 6,263,566 B1 | 7/2001 | Hembree et al. |
| 6,265,766 B1 | 7/2001 | Moden |
| 6,281,042 B1 | 8/2001 | Ahn et al. |
| 6,285,204 B1 | 9/2001 | Farnworth |
| 6,294,839 B1 | 9/2001 | Mess et al. |
| 6,297,547 B1 | 10/2001 | Akram |
| 6,303,981 B1 | 10/2001 | Moden |
| 6,326,698 B1 | 12/2001 | Akram |
| 6,329,222 B1 | 12/2001 | Corisis et al. |
| 6,331,221 B1 | 12/2001 | Cobbley |
| 2001/0008794 A1 * | 7/2001 | Akagawa .................. 438/620 |

\* cited by examiner

METHODS OF THINNING MICROELECTRONIC WORKPIECES

TECHNICAL FIELD

The present invention relates to an apparatus and method for increasing microelectronic device density. The invention has particular utility in connection with producing low-profile microelectronic device assemblies.

BACKGROUND

Semiconductor dies are commonly manufactured as part of a large wafer, then singulated. To withstand the rigors of processing and polishing, such wafers are typically on the order of 20–30 mils (about 500–760 μm), with larger wafers tending to be thicker. With today's larger wafer diameters, most conventional semiconductor dies have a thickness in excess of 25 mils (about 635 μm), e.g., about 28 mils (about 710 μm) for 300 mm diameter wafers. Increasingly, however, microelectronic device designs are calling for thinner dies. Using a thinner die yields a microelectronic device assembly having a lower profile, occupying less space. Sometimes, thinned dies are stacked vertically atop one another to further increase die density, preserving valuable substrate real estate. The upper die is commonly attached to the lower die then electrically coupled to the substrate.

Thinner semiconductor dies are commonly formed by grinding the back surface of a thicker wafer before slicing the wafer to produce a number of thinned, singulated dies. To protect electrical contacts and other features, the active surface of the thicker wafer is commonly coated with a protective coating, e.g., a layer of a polyimide. The unprotected back surfaces of the wafers may then be ground using chemical-mechanical or mechanical planarizing tools. Many of these protective coatings tend to shrink after they cure. This places the coated active surface of the die in compression while placing the exposed back surface of the die in tension. At its initial thickness of more than 25 mils, the wafer is typically stiff enough to withstand these forces. As the wafer become progressively thinner during grinding, however, the stress caused by the protective coating tends to warp the wafer. This warpage becomes more pronounced as conventional wafer sizes are increased from 200 mm diameters to diameters of 300 mm or more.

Warped wafers lead to significant product losses. First, the wafers are conventionally attached to dicing tape before the dies are singulated. This requires warped wafers to be pressed flat to provide uniform contact of the wafer surface with the dicing tape. The entire wafer may be damaged under the forces necessary to flatten the wafer against the dicing tape. Even after the previously warped wafer has been singulated into individual dies, the individual dies may still be warped. This makes it more difficult for automated handling machinery to pick up the individual dies with the required accuracy and precision. The residual stress in the warped dies also weakens the die, making it easier to propagate small cracks through the die. As a consequence, dies which survive the wafer thinning and singulation process may be damaged while assembling microelectronic device assemblies, leading to higher losses of the final, higher-value assembled devices.

To minimize unacceptable product losses due to wafer warping, the minimum wafer thickness deemed practical in a commercial environment is on the order of 10–12 mils (about 250–305 μm). In most semiconductor dies, the active features of the die are located within 20 μm or less of the active surface of the die. Conventional handling and processing equipment, therefore, places a practical limit on the thickness of semiconductor dies which is 10–15 times as thick as that necessary to provide a die with the requisite active features.

In U.S. Pat. No. 5,273,940, the entirety of which is incorporated herein by reference, Sanders proposes a multiple-chip package with thinned semiconductor chips. A number of chips are mounted on a surface of a substrate and encapsulation material is placed on the surface of the substrate around the semiconductor chips. A grinding wheel is then used to grind down both the semiconductor chips and the encapsulation material to a desired thickness. Sanders claims that this process can reduce a semiconductor chip from an initial thickness of about 20 mils (508 μm) to 4.5–5 mils (114.3–127 μm).

Sanders claims to yield semiconductor chips which are significantly thinner than those which can be handled reliably in a commercial production environment, but the presence of the encapsulation material on the surface of the substrate limits the utility of this approach. As noted above, semiconductor dies are frequently stacked vertically atop one another to increase die density on the substrate. Because Sanders' encapsulation material covers the surface of the substrate, additional dies stacked on the thinned dies cannot be electrically coupled to the substrate directly using conventional wire bonding. Grinding the exposed surfaces of the semiconductor chips would also grind away active features provided on the back surface of the chips. As a consequence, Sanders provides no mechanism for electrically coupling a second chip to the upper surface of the thinned chips on the substrate. As a result, Sanders does not propose a mechanism for manufacturing microelectronic device assemblies with stacked dies.

SUMMARY

Embodiments of the present invention provide low-profile microelectronic device assemblies and methods for manufacturing such microelectronic device assemblies. One embodiment of the invention provides a method of assembling a stacked microelectronic device assembly from a microelectronic device sub-assembly. The sub-assembly may include a support having a first electrical contact and a first die attached to and electrically coupled to the support. In accordance with this method, the first die of the microelectronic device sub-assembly is mechanically thinned while the first electrical contact is exposed. This may be accomplished by grinding a back surface of the first die. Thereafter, a second die may be connected to the first die and the second die may be electrically coupled to the exposed first electrical contact.

A method in accordance with an alternative embodiment of the invention reduces the thickness of a microelectronic device assembly which includes a support and a first die, the first die being electrically coupled to the support and attached to a mounting surface of the support. In accordance with this method, an exposed back surface of the first die is ground with the mounting surface of the support partially exposed. This reduces the thickness of the first die. If so desired, a second die may be connected to the first die and this second die may be electrically coupled to the support.

Another embodiment of the invention provides a method of assembling a microelectronic device assembly. In accordance with this method, a first die is connected to a support. An underfill gap is defined between an active surface of the first die and a mounting surface of a support. This gap can be filled with an underfill material, leaving a portion of the mounting surface exposed. Thereafter, the thickness of the first die is reduced, e.g., by grinding a back surface of the first die. If so desired, a second die may then be connected to the first die.

Another embodiment of the invention provides a method of assembling a microelectronic device assembly which includes a support, a first die, and a second die. The support has a mounting surface, a first contact and a second contact. The first die may have an active surface bearing a third contact and the second die may have a fourth contact. The active surface of the first die is mechanically supported with respect to the mounting surface of the support. The first contact of the support is electrically coupled to the third contact of the fist die. The thickness of the first die is reduced, such as by grinding a back surface of the die. Thereafter, the second die is connected to the first die and the second contact of the substrate may be electrically coupled to the fourth contact of the second die. The first die may be mechanically supported with respect to the support by introducing a mechanically stable material in a gap between the active surface and the mounting surface.

Still another embodiment of the invention provides a method of assembling a stacked microelectronic device assembly from a microelectronic device sub-assembly. This microelectronic device sub-assembly includes a support and a first die attached to and electrically coupled to the support. An exposed back surface of the first die is ground, thereby reducing the thickness of the first die. Thereafter, a redistribution layer is attached to the ground back surface of the first die. A second die is connected to the redistribution layer and electrically coupled to the first die via the redistribution layer.

A microelectronic device assembly in accordance with another embodiment of the invention comprises a support including a partially exposed mounting surface and a first electrical contact. A first die having a thickness of no greater than 4 mils has an active surface having a second electrical contact. The active surface of the first die faces and is mounted on the mounting surface of the support and the first electrical contact is coupled to the second electrical contact.

A microelectronic device assembly in accordance with a further embodiment of the invention comprises a support, a first die and a second die. The support includes a mounting surface, a first electrical contact, and a second electrical contact. The first die has a thickness of no more than 4 mils. The first die includes a ground back surface and an active surface having a third electrical contact. The active surface of the first die faces and is mounted on the mounting surface of the support. The first electrical contact is coupled to the second electrical contact. The second die is carried by the ground back surface of the first die. The second die is electrically coupled to the second electrical contact of the support.

Yet another embodiment of the invention provides a microelectronic device assembly which includes a support, a first die, a second die and an intermediate layer. The support includes a mounting surface and a first electrical contact. The first die has a thickness of no more than 4 mils and includes a ground back surface having an electrical element and an active surface having a second electrical contact. The active surface of the first die may face and be mounted on the mounting surface of the support and the first electrical contact may be coupled to the second electrical contact. The second die has a third contact carried on a facing surface. The intermediate layer may be disposed between the ground back surface of the first die and the facing surface of the second die. The intermediate layer can be electrically coupled to the electrical element of the first die and to the third contact of the second die.

DETAILED DESCRIPTION

Figure 1:
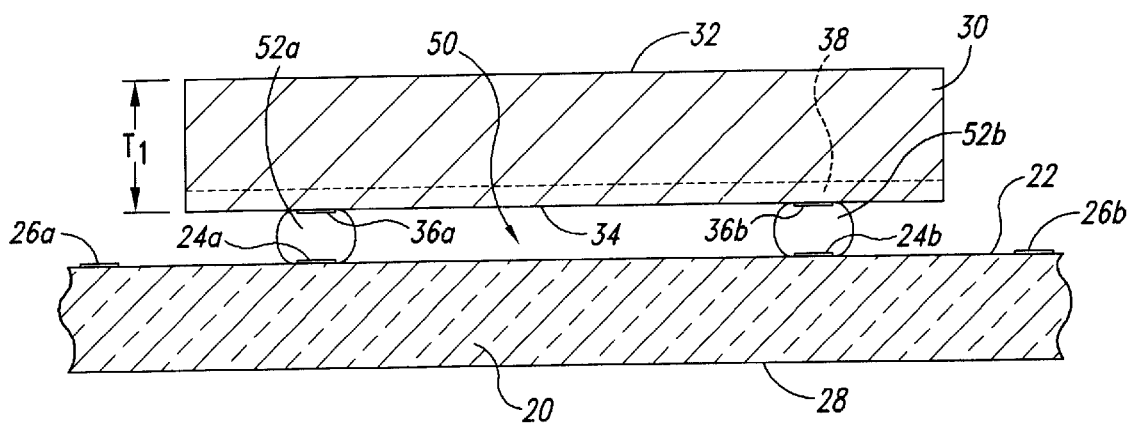
FIGS. 1–5 are cross-sectional views that schematically illustrate sequential stages in manufacturing a microelectronic device assembly in accordance with one embodiment of the invention.

Various embodiments of the present invention provide microelectronic device assemblies and methods of manufacturing microelectronic device assemblies. The following description provides specific details of certain embodiments of the invention illustrated in the drawings to provide a thorough understanding of those embodiments. It should be recognized, however, that the present invention can be reflected in additional embodiments and the invention may be practiced without some of the details in the following description.

FIGS. 1–5 schematically illustrate stages in the manufacture of a microelectronic device assembly 10 in accordance with one embodiment of the invention. FIG. 1 illustrates a first die 30 electrically coupled to a support 20. The support 20 includes a mounting surface 22 having a plurality of first electrical contacts 24 (identified individually by reference numbers 24a and 24b) and plurality of second electrical contacts 26 (identified individually by reference numbers 26a and 26b). The support 20 also includes a rear surface 28 which faces away from the first die 30.

The support 20 may be flexible or rigid and have any desired configuration. The support 20 may be formed of materials commonly used in microelectronic substrates such as ceramic, silicon, glass or combinations thereof. The support 20 can alternatively be formed of an organic material or other materials suitable for printed circuit boards or the like.

The first die 30 has a back surface 32 and an active surface 34 bearing a plurality of third electrical contacts 36a–b. The first die 30 may be any suitable microelectronic component, such as a digital signal processor (DSP), DRAM, flash-memory, a processor, or any of a variety of other types of microelectronic devices. Typically, the first die 30 is a silicon die carrying an integrated circuit immediately adjacent the active surface 34. In one embodiment, the die includes an integrated circuit which is electrically coupled to the third electrical contacts 36 and is contained within an active region 38 of the first die 30. The active region may include a majority, if not all, of the active features of the integrated circuit. The depth or thickness of the active region 38 can be varied as desired. In certain embodiments, the active region 38 is no thicker than 20 $\mu$m as measured from the active surface 34 of the first die 30.

The first die 30 is shown as having an initial thickness $T_1$ which significantly exceeds the thickness of the active region 38. This initial thickness $T_1$ can be varied as desired. Typically, however, the initial thickness $T_1$ will be the same thickness as the thickness of the wafer from which the first die 30 is initially singulated. This initial thickness may, for example, be on the order of 20–30 mils (about 500–760 μm). In one embodiment wherein the first die 30 is singulated from a wafer (not shown) having an initial manufactured diameter of about 300 mm, the initial thickness $T_1$ of the first die 30 is about 28 mils (about 710 μm).

The first die 30 may be attached to the support 20 in any desired fashion. In the embodiment illustrated in FIGS. 1–5, the first die 30 is physically attached to the mounting surface 22 of the support 20. In particular, the first die 30 is superimposed over a portion of the mounting surface 22 bearing the first contacts 24. The first contacts 24 may be arranged on the mounting surface 22 in a predetermined array, and the third contacts 36 may be arranged in a corresponding array on the active surface 34 of the first die 30. When the first die 30 is superimposed over the mounting surface 22, each of the third contacts 36 may be aligned with a first contact 24. Hence, third contact 36a may be positioned vertically above the first contact 24a and the third contact 36b may be positioned vertically above the first contact 24b.

The first contacts 24 may be electrically coupled to a corresponding one of the third contacts 36 on the first die 30 in any suitable fashion. In one embodiment of the invention, conventional flip-chip manufacturing techniques may be employed. Such techniques are well known in the art and need not be discussed in great detail here. Briefly, though, a connecting material is deposited on at least one of the sets of electrical contacts 24 and 36 which are to be electrically coupled. For example, solder "bumps" may be deposited on one or more of the third contacts 36 of the first die 30. The connecting material need not be solder, though. Instead, it may be any of any variety of other materials known in the art, such as gold, indium, tin, lead, silver, or alloys thereof that reflow to make electrical interconnects. The connecting material may also be formed of conductive polymeric or epoxy materials, which may be plated with metals.

The active surface 34 of the first die 30 may be juxtaposed with the mounting surface 22 of the support 20 so that at least some of the third contacts 36 are aligned with a corresponding first contact 24. The connecting material may extend between and electrically couple a first contact 24 to a corresponding third contact 36 of the first die 30, as shown in FIG. 1. The connecting material may be reflowed, if necessary, to electrically couple the first and third contacts 24 and 36. The resultant electrical connector 52 may also serve to mechanically connect the first die 30 to the mounting surface 22 of the support 20. As can be seen in FIG. 1, one electrical connector 52a may electrically couple the first contact 24a to the third contact 36a. A separate electrical connector 52b may electrically couple the first contact 24b to the third contact 36b.

Figure 2:
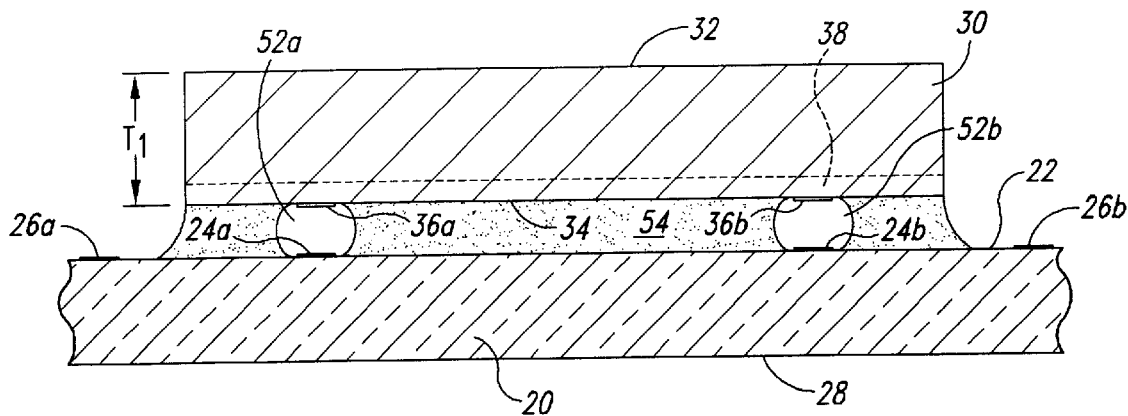

The electrical connectors 52 also space the active surface 34 of the first die 30 from the mounting surface 22 of the support 20. This defines a peripherally open underfill gap 50 between the mounting surface 22 and the active surface 34. As shown in FIG. 2, an underfill material 54 may be introduced into the underfill gap 50 between the support 20 and the first die 30. This underfill material 54 may help equalize stress placed on the components and protect the electrical connectors 52 from contaminants, such as moisture and chemicals. The underfill material 54 may accordingly seal the space in the underfill gap 50. The underfill material 54 may also mechanically support the active surface 34 of the first die 30 with respect to the mounting surface 22 of the support 20. In one embodiment, the underfill material 54 substantially fills the underfill gap 50, providing mechanical support across the majority of the active surface 34 of the first die 30. Any of a variety of underfill materials used in conventional flip chip manufacture can be used as the underfill material 54. The underfill material 54 may be introduced into the underfill gap 50 in any conventional fashion. For example, it may be applied before the first die 30 is attached to the support 20, or it may be introduced after the first die 30 is positioned proximate the support 20.

Figure 3:
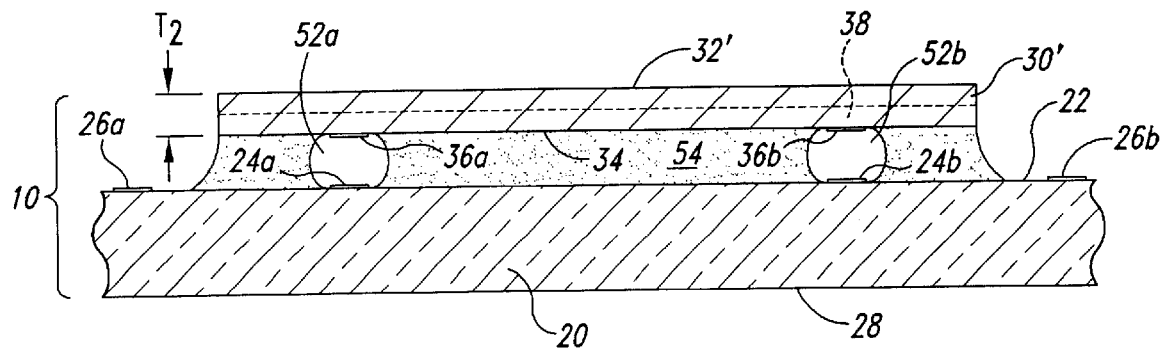

As shown by comparing FIGS. 2 and 3, the thickness of the mechanically supported first die 30 is reduced from its initial thickness $T_1$ to a thinner reduced thickness $T_2$. The reduced thickness $T_2$ in this embodiment may be at least as great as the thickness of the active region 38. In one embodiment, the reduced thickness $T_2$ is greater than the thickness of the active region 38, leaving a buffer between the active region 38 and the new back surface 32' of the thinned first die 30'. It is anticipated for most applications that the reduced thickness $T_2$ will be no greater than 10 mils (about 250 microns). In one embodiment of the invention, the reduced thickness $T_2$ of the thinned first die 30' is no greater than 4 mils (about 100 microns). In a further embodiment, the reduced thickness $T_2$ is no greater than 1 mil (about 25 microns).

The thickness of the first die 30 can be reduced from the initial thickness $T_1$ to the reduced thickness $T_2$ in any desired fashion. In one embodiment, the first die 30 is chemically etched to reduce the thickness. In another embodiment, the first die 30 is mechanically and/or chemically-mechanically thinned, such as by grinding the back surface 32 with an abrasive material. Rotated grinding disks and abrasive media are widely known and used in the chemical-mechanical polishing (CMP) of semiconductor wafers. It is anticipated that such devices and materials can be used to mechanically thin the first die 30. U.S. Pat. No. 6,242,931, the entirety of which is incorporated herein by reference, outlines processes for thinning a substrate which may be suitable for thinning the first die 30.

When the first die 30 is mechanically thinned, the original back surface 32 of the first die 30 is ground away. This exposes a new ground back surface 32' on the thinned first die 30'. This ground back surface 32' can be substantially flat as shown. Alternatively, the ground back surface 32' can be physically altered to yield a more complex surface. A variety of physically altered surfaces and methods of forming such surfaces are taught in U.S. Pat. No. 6,184,064, the entirety of which is incorporated herein by reference. A more complex ground back surface 32' may improve adhesion with an encapsulation material or with a second die attach adhesive 75 used to attach a second die 70, as explained below in connection with FIGS. 4 and 5.

It is anticipated that reducing the thickness of the first die 30 after it has been singulated and then is connected to the support 20 in accordance with an embodiment of the present invention can significantly improve yields of low-profile microelectronic device assemblies 10. As noted above, commercial handling equipment and assembly techniques become less practical with semiconductor dies which are at least 10–12 mils thick; handling and manufacturing losses can be unacceptable if thinner dies are used without first connecting the dies to the support before thinning them because of die warpage. In accordance with several embodiments of the process outlined in connection with FIGS. 1–3, however, the first die 30 can be relatively thick when it is individually handled by conventional die handling equipment because it is not thinned until after it has been singulated and attached to the support. The support 20 accordingly inhibits warpage of the thinned dies 30 to mitigate damage to the dies during the assembly process by thinning the first die 30 after it is connected to the support 20. As a result, the losses attributable to handling of the individual singulated dies need be no greater than those commonly encountered when handling standard-thickness dies.

Several embodiments of the process outlined in connection with FIGS. 1–3 also provide some meaningful advantages over the process suggested by Sanders in U.S. Pat. No. 5,273,940, noted above. As explained previously, Sanders covers the entire surface of the substrate with an encapsulant. A grinding wheel is then used to grind both the encapsulant and the semiconductor chips. In the process outlined in FIGS. 1–3, however, the mounting surface 22 of the support 20 remains exposed when the thickness of the first die 30 is reduced. This can speed up the grinding process because the grinding wheel need only grind away the material of the first die 30 rather than the die and a surrounding expanse of encapsulant. As shown in FIG. 3, this embodiment of the invention also leaves features of the mounting surface 22 exposed for later access. For example) the second contacts 26 on the mounting surface 22 remain exposed so additional microelectronic components may be electrically coupled to the mounting surface 22 of the support 20.

Figure 4:
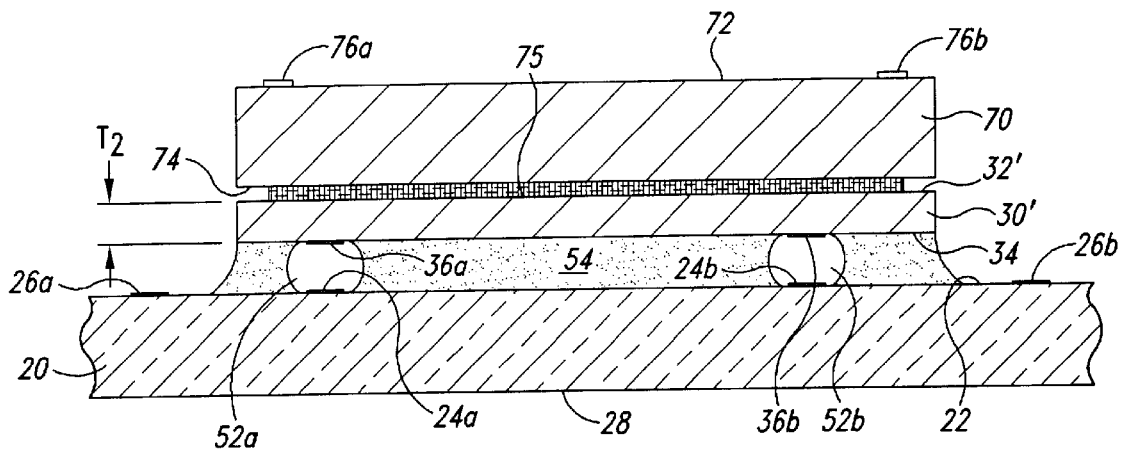
Figure 5:
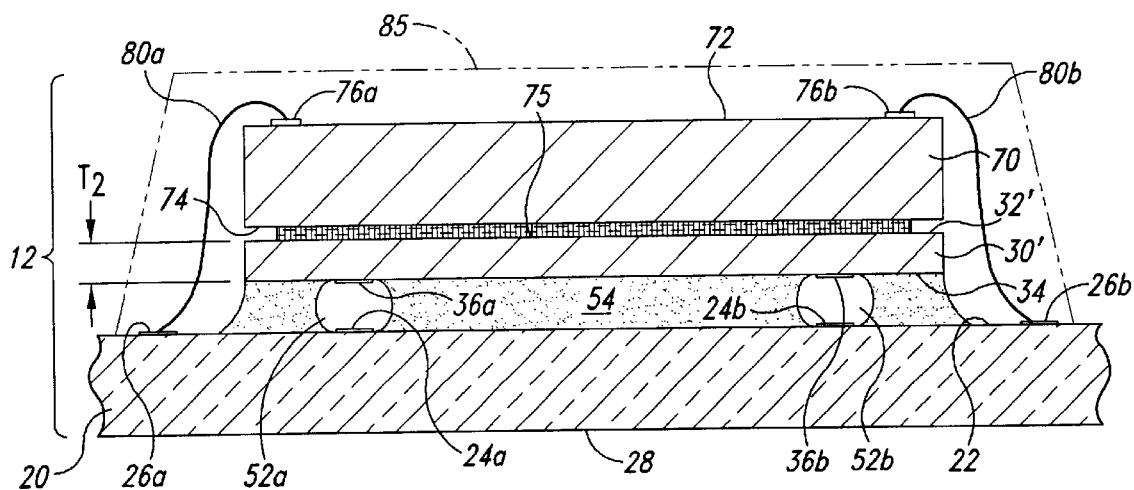

FIGS. 4 and 5 illustrate another embodiment of the invention which further capitalizes on the continued exposure of a portion of the mounting surface 22 after thinning of the first die 30. In accordance with the further method outlined in FIGS. 4 and 5, a second die 70 may be connected to the thinned first die 30' and electrically coupled to the support 20 of FIG. 3.

Like the first die 30, the second die 70 can be any of a variety of microelectronic devices, including DSP, DRAM, flash-memory or processors. The second die 70 is shown as being a single element, but it could comprise any number of sub-components. The first and second dies 30 and 70 may be the same type of dies or they may be different from one another. For example, both of the dies 30 and 70 may comprise memory modules, such as DRAMs. In a no commercial manufacturing operation, the second die 70 typically will be handled by conventional die handling equipment. As a consequence, it is anticipated that the second die 70 will have a thickness which is greater than the reduced thickness $T_2$ of the thinned first die 30'. For example, the thinned first die 30' may have a reduced thickness $T_2$ of 4 mils or less while the second die 70 has a thickness of 10 mils or more. It is anticipated that the second die 70 will typically have a thickness of 10–30 mils, and more commonly 12–28 mils. In one embodiment of invention, the second die 70 has the same thickness as the original thickness of the wafer from which it is singulated, which may be on the order of 28 mils for a 300 mm diameter wafer, as explained previously.

The second die 70 can be attached to the thinned first die 30' in any desired fashion. In the illustrated embodiment, a facing surface 74 of the second die 70 is attached to the ground back surface 32' of the thinned first die 30' by a layer of a die attach adhesive 75. The die attach adhesive 75 may be any conventional adhesive or other structure used to connect stacked dies to one another. In one embodiment, the die attach adhesive 75 comprises a curable adhesive compound. In another embodiment, the die attach adhesive 75 comprises a bonding tape.

If the first die 30 is mechanically thinned and/or chemically-mechanically thinned, the ground back surface 32' of the thinned first die 30' and the exposed mounting surface 22 of the support 20 may bear some residue. In one embodiment of the invention, the microelectronic device assembly 10 including the thinned first die 30' and the support 20 (e.g., as shown in FIG. 3) is cleaned before the second die 70 is attached to the thinned first die 30', such as by washing with deionized water or other suitable medium which will not adversely affect the microelectronic device assembly 10.

As shown in FIG. 5, the second die 70 may be electrically coupled directly to the support 20. In the illustrated embodiment, the second die 70 includes a plurality of fourth electrical contacts 76a–76b on an outer surface 72. These fourth contacts 76 may be electrically coupled to the second contacts 26 carried on the support 20 in any suitable fashion. In the embodiment shown in FIG. 5, this electrical coupling is accomplished using bonding wires 80. Hence, a first bonding wire 80a electrically couples the fourth contact 76a to the second contact 26a. A second bonding wire 80b electrically couples the fourth contact 76b to the second contact 26b. FIGS. 4 and 5 show the physical attachment of the second die 70 to the thinned first die 30' and the electrical coupling of the second die 70 to the support 20 as two separate steps. It should be understood, though, that this is merely for purposes of illustration and these connections may be made simultaneously or in any desired order.

If so desired, an encapsulant 85 may be added to the resultant structure. In the illustrated embodiment, the encapsulant 85 encapsulates the thinned first die 30', the second die 70, the bonding wires 80 and the second contacts 26. The encapsulant 85 may cover the remainder of the mounting surface 22 which remains exposed beyond the periphery of the thinned first die 30' and the underfill material 54. In another embodiment, a portion of the mounting surface 22 remains exposed even after the encapsulant 85 is applied.

Figure 6:
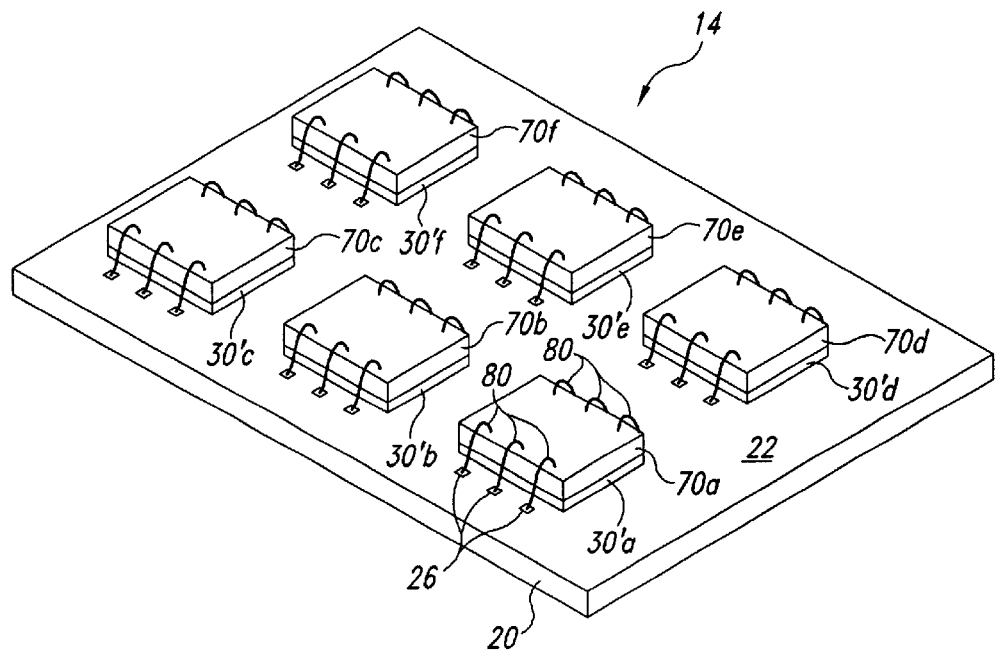
FIG. 6 is a schematic isometric view of a stacked microelectronic device assembly in accordance with another embodiment of the invention.

It is anticipated that a plurality of dies can be attached to the support 20 at locations spaced about the mounting surface 22. FIG. 6 illustrates a microelectronic device assembly 14 which includes a plurality of stacked die assemblies. The device assembly 14 can be fabricated by connecting all of the lower dies 30 to the mounting surface 22 of the support 20 at spaced-apart locations adjacent an associated set of second contacts 26. The support 20 with the lower dies 30 is then loaded into a CMP machine in which all of the dies 30 are background to produce a plurality of thinned dies 30' (shown as 30'a–f). The second dies 70 are the mounted to the thinned dies 30'. For example, each of the thinned first dies 30'a–f may carry an associated second die 70a–f, respectively. The second dies 70a–f may be electrically coupled to the second contacts 26 carried on the mounting surface 22 of the support 20 by bonding wires 80.

FIG. 6 illustrates six stacked die assemblies on the support 20. It should be recognized, however, that any number of stacked die assemblies or thinned single dies 30' can be carried by the support 20. It may be advantageous to form a relatively large number of stacked die assemblies on a single support for manufacturing purposes. After the stacked die assemblies are formed and coupled to the support 20 as shown in FIG. 6, each of the stacked die assemblies may be separately encapsulated in an encapsulant 85 (not shown in FIG. 6) and the support 20 can be diced into a plurality of separate microelectronic device packages.

Figure 7:
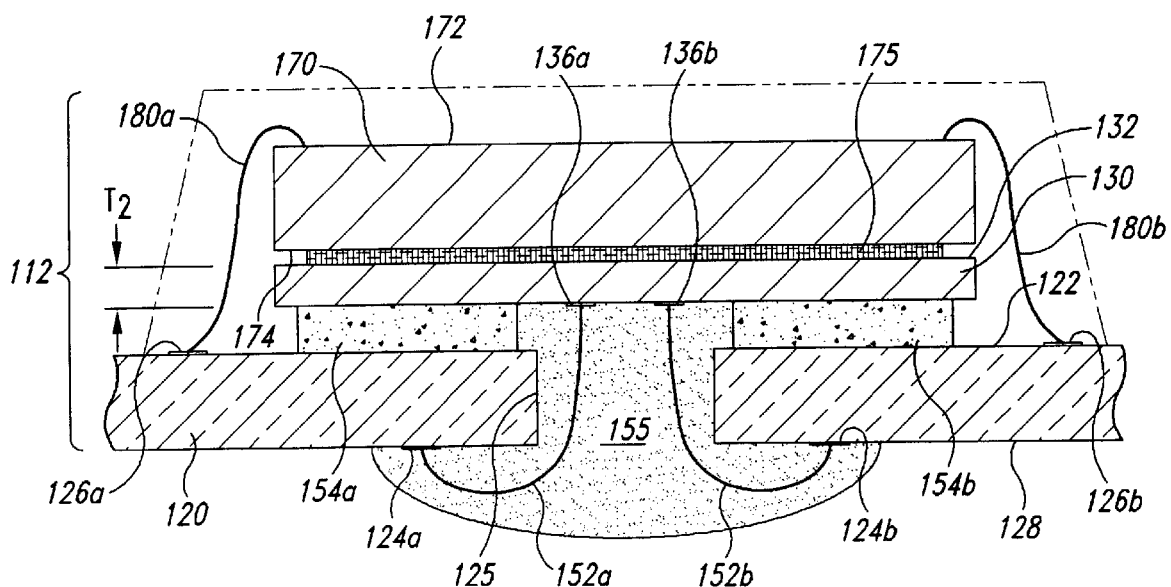
FIG. 7 is a schematic cross-sectional view of a microelectronic device assembly in accordance with yet another embodiment of the invention.

FIG. 7 illustrates a microelectronic device assembly 112 in accordance with another embodiment of the invention. Many of the elements in FIG. 7 are functionally similar to elements in FIG. 5. For purposes of comparison with FIG. 5, the reference numbers used in FIG. 7 are similar to the reference numbers used in FIG. 5, but incremented by 100. Hence the support of FIG. 5 bears reference number 26 and the support of FIG. 7 bears reference number 120.

One difference between the embodiment of FIGS. 1–5 and the embodiment of FIG. 7 relates to the manner in which the first die 30 or 130 is connected to the support 20 or 120, respectively. In the embodiment of FIGS. 1–5, the first die 30 is physically attached and electrically coupled to the mounting surface 22 of the support 20 using flip chip techniques. In the embodiment of FIG. 7, however, the first die 130 is attached to the support 20 using "board on chip" (BOC) techniques.

BOC techniques are widely known and need not be detailed here. Briefly, though, the first die 130 may be attached to the mounting surface 122 of the support 120, e.g., by a pair of spaced-apart bonding tapes 154a and 154b. A plurality of first contacts 124a–b are carried on the rear surface 128 of the support 120 adjacent a slot 125 through the support 120. These first contacts 124a–b are coupled to corresponding third contacts 136a–b by bonding wires 152a–b which pass through the slot 125. If so desired, the first contacts 124, third contacts 136 and bonding wires 152 may all be encapsulated in a gob top coating 155, as is known in the art. Once the first die 130 is connected to the support 120, it may be thinned to a reduced thickness $T_2$ and the second die 170 may be attached to the first die 130 and coupled to the support 120, all as outlined above in connection with FIGS. 1–5.

FIGS. 8–12 illustrate another alternative embodiment of the invention. Many of the elements in FIGS. 8–12 are functionally similar to elements in FIGS. 1–5. For purposes of comparison with FIGS. 1–5, the reference numbers used in FIGS. 8–12 are similar to the reference numbers used in FIGS. 1–5, but incremented by 200. Hence the support of FIG. 1 bears reference number 20 and the support of FIG. 8 bears reference number 220.

Figure 8:
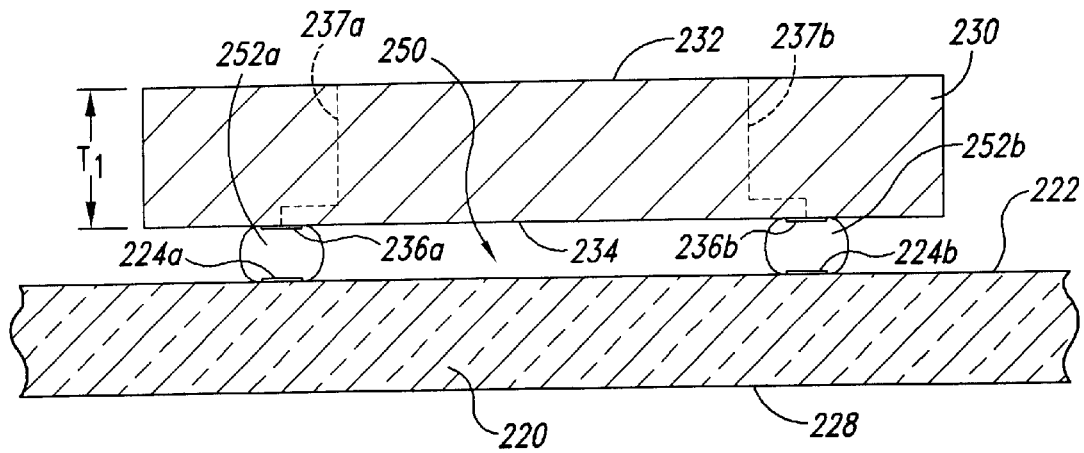
FIGS. 8–12 are cross-sectional views that schematically illustrate sequential stages in manufacturing an alternative microelectronic device assembly in accordance with still another embodiment of the invention.
Figure 9:
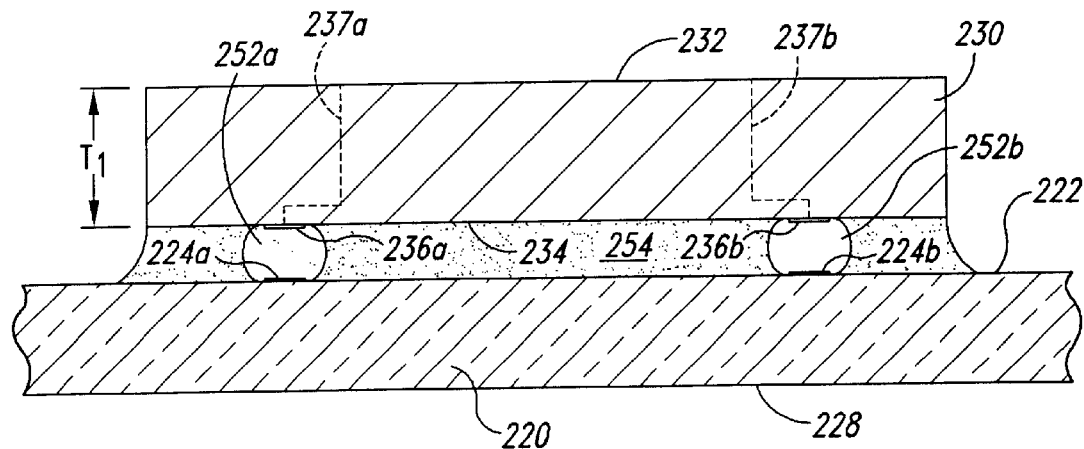
Figure 10:
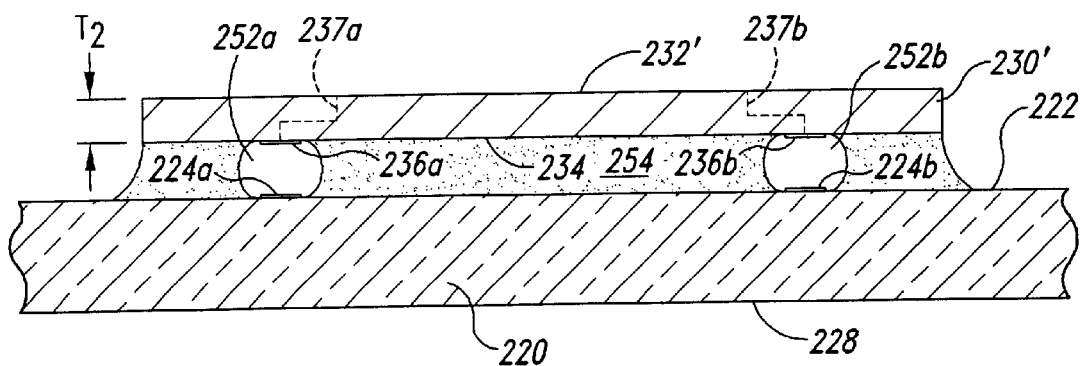

The structures shown in FIGS. 8–10 directly parallel the structures shown in FIGS. 1–3. One difference between the first die 230 of FIGS. 8–10 and the first die 30 of FIGS. 1–3 is that the first die 230 includes internal electrical elements 237 which can be used to electrically couple the second die 270 (FIG. 12) to the first die 230. The electrical elements 237 extend away from the active surface 234 of the first die 230 a sufficient distance to permit them to be exposed on the ground back surface 232' of the thinned first die 230'. In the illustrated embodiment, a first electrical element 237a is electrically coupled to one third contact 236a and a second electrical element 237b is electrically coupled to a separate third contact 236b. This is a simplified drawing intended to schematically illustrate certain aspects of this embodiment. One or more of the electrical elements 237 may be connected to active features (not shown) in the first die 230. Alternatively, the electrical elements 237 may present a relatively direct electrical connection between the back surface 232 of the first die 230 and the contacts 236 carried on the active surface 234, as shown.

FIGS. 8 and 9 show the electrical elements 237 extending through the entire initial thickness $T_1$ of the first die 230. This is not necessary, though. The electrical elements 237 need only extend back from the active surface 234 a distance sufficient to span the reduced thickness $T_2$ of the thinned die 230'. Regardless of the initial length of the electrical elements 237, when the first die 230 is thinned to its reduced thickness $T_2$, the circuits 237 may define a plurality of electrical elements exposed on the ground back surface 232'.

Figure 11:
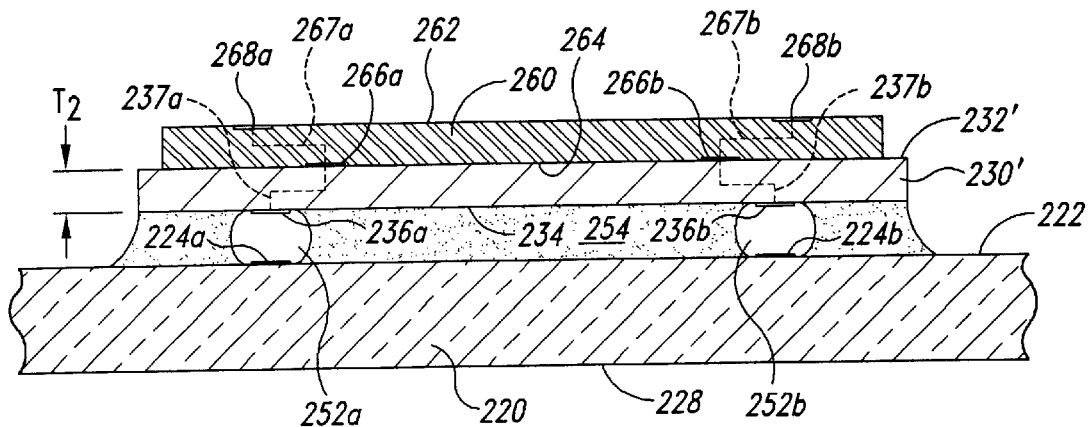

As shown in FIG. 11, an intermediate layer 260 may be attached to the ground back surface 232' of the thinned first die 230'. This intermediate layer 260 may include a first bonding surface 264 and a second bonding surface 262. A plurality of first die contacts may be exposed on the first bonding surface 264 and a plurality of second die contacts 268a–b may be carried by the second bonding surface 262. One or more intermediate circuits 267a–b may be provided to electrically connect one of the first die contacts 266 to a corresponding one of the second die contacts 268, providing an electrical pathway through the intermediate layer.

The first die contacts 266 are adapted to be electrically coupled to the ends of the electrical elements 237 which are exposed on the ground back surface 232' of the first die 230'. If so desired, the ground back surface 232' may be etched or otherwise prepared to ensure an adequate electrical connection between the exposed electrical elements 237 of the first die 230 and the corresponding first die contacts 266 of the intermediate layer 260.

Figure 12:
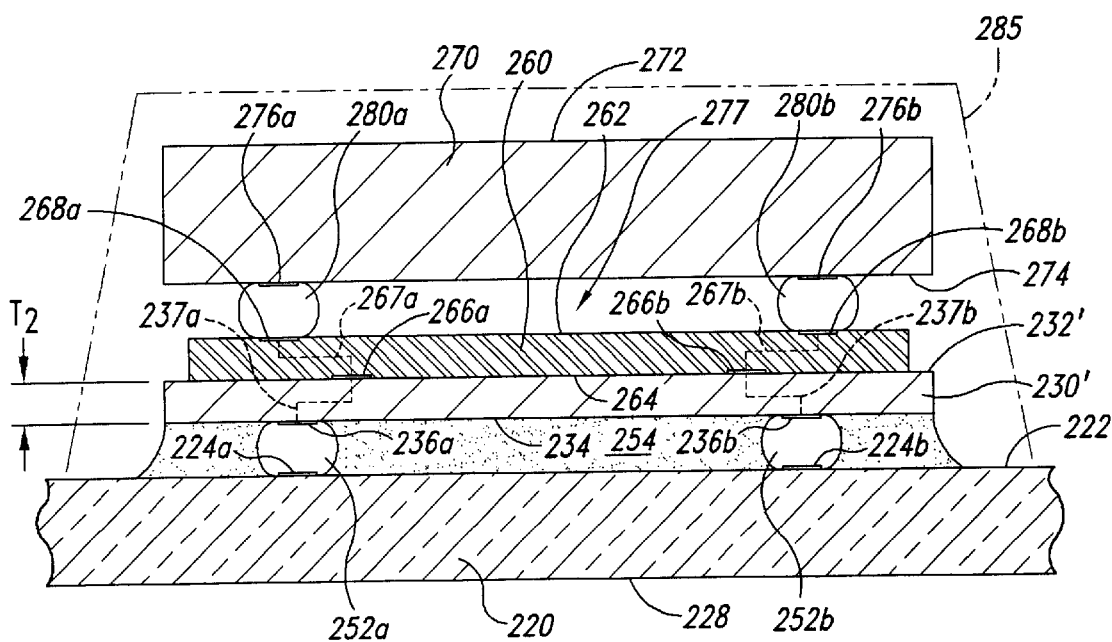

As shown in FIG. 12, a second die 270 may be electrically coupled to the second die contacts 268 of the intermediate layer 260. While this can be accomplished in any fashion, the embodiment of FIG. 12 is particularly well suited for flip chip manufacturing techniques. In accordance with one such embodiment, solder balls or other suitable electrical connectors 280a–b electrically couple fourth electrical contacts 276 carried on the facing surface 274 of the second die 270 to corresponding second die contacts 268 on the second bonding surface 262 of the intermediate layer 260. The fourth contacts 276 may be electrically coupled to active elements (not shown) in the thinned first die 230'. In the illustrated embodiment, however, the second die 270 is electrically coupled to the first contacts 224 on the support 220. In particular, the fourth contacts 276 of the second die 270 are electrically coupled to the electrical elements 237 of the thinned first die 230'. In turn, these electrical elements 237 are electrically coupled to the first contacts 224 via electrical connectors 252.

From the foregoing, it will be appreciated that specific embodiments of the invention have been described herein for purposes of illustration, but that various modifications may be made without deviating from the spirit and scope of the invention. Accordingly, the invention is not limited except as by the appended claims.

I claim:

1. A method of assembling a stacked microelectronic device assembly from a microelectronic device subassembly, the microelectronic device subassembly including a support having a first electrical contact and a first die attached to and electrically coupled to the support, the method comprising:

thinning the first die of the microelectronic device subassembly while the first electrical contact is exposed;

connecting a second die to the first die after thinning the first die, leaving the first electrical contact exposed; and thereafter, electrically coupling the second die to the exposed first electrical contact.

2. The method of claim 1 wherein the first die has a back surface, and thinning the first die comprises grinding the back surface of the first die.

3. The method of claim 1 wherein the second die is selected to be thicker than the thinned first die.

4. The method of claim 1 wherein the first die is thinned to a thickness of no greater than 4 mils.

5. The method of claim 1 wherein the first die is thinned to a thickness of no greater than 1 mil.

6. The method of claim 1 wherein the second die is electrically coupled to the first electrical contact via a bonding wire.

7. The method of claim 1 further comprising cleaning the microelectronic device subassembly after the first die is thinned but before the second die is connected to the first die.

8. A method of reducing a thickness of a microelectronic device assembly including a support and a first die electrically coupled to the support, the first die being attached to a mounting surface of the support, the method comprising grinding an exposed back surface of the first die with a support contact carried by the mounting surface of the support exposed, thereby reducing a thickness of the first die; connecting a facing surface of a second: die to the ground back surface of the first die; and, thereafter, electrically coupling a die contact to the support contact, the die contact being carried on an outer face of the second die.

9. The method of claim 8 further comprising cleaning the ground back surface of the first die before connecting the second die to the first die.

10. The method of claim 8 wherein the second die is connected to the first die by a die attach adhesive.

11. The method of claim 8 wherein the support contact is electrically coupled to the die contact by a bonding wire.

12. The method of claim 8 wherein the thickness of the first die is reduced to no greater than 4 mils.

13. The method of claim 8 wherein the thickness of the first die is reduced to no greater than 1 mil.

14. The method of claim 8 wherein the second die is connected to the first die by a bonding tape.

15. A method of assembling a microelectronic device assembly, comprising:
   connecting a first die to a support;
   filling at least a portion of an underfill gap defined between an active surface of the first die and a mounting surface of the support with an underfill material in a manner that leaves a portion of the mounting surface adjacent to the die exposed;
   reducing the thickness of the first die after filling;
   physically attaching a second die to the first die, the second die having an outer surface carrying a second die contact; and
   electrically coupling the second die contact to a support contact on the mounting surface by a bonding wire.

16. The method of claim 15 wherein the thickness of the first die is reduced by grinding a back surface of the first die.

17. The method of claim 15 wherein connecting the first die to the mounting surface of the support comprises electrically coupling a first contact carried by the support to a second contact carried on the active surface of the first die.

18. The method of claim 17 wherein the underfill material is applied to the active surface or the mounting surface before connecting the first die to the mounting surface.

19. The method of claim 17 wherein the underfill gap is filled with underfill material after the first die is electrically coupled to the support.

20. The method of claim 15 wherein the support has an external surface, connecting the first die to the mounting surface of the support comprising physically attaching the first die to the support with the active surface facing the mounting surface and electrically coupling the active surface of the first die to the external surface of the support.

21. The method of claim 15 further comprising cleaning the ground back surface of the first die before connecting the second die to the first die.

22. A method of assembling a microelectronic device assembly including a support, a first die, and a second die; the support having a rear surface bearing a first contact and a mounting surface bearing a second contact; the first die having an active surface bearing a third contact; and the second die having an outer surface bearing a fourth contact; the method comprising:
   mechanically supporting the active surface of the first die with respect to the mounting surface of the support;
   electrically coupling the first contact to the third contact;
   reducing the thickness of the first die;
   connecting the second die to the first die after reducing the thickness of the first die, the second die being connected such that its outer surface and the fourth contact are exposed; and
   electrically coupling the second contact to the fourth contact.

23. The method of claim 22 wherein the first die has a back surface, reducing the thickness of the first die comprising grinding the back surface of the first die.

24. The method of claim 22 wherein the second die is thicker than the mechanically thinned first die.

25. The method of claim 22 wherein the thickness of the first die is reduced to no greater than 4 mils.

26. The method of claim 22 wherein the thickness of the first die is reduced to no greater than 1 mil.

27. The method of claim 22 wherein the second and fourth contacts are coupled by a wire bond.

28. The method of claim 22 further comprising providing a mechanically stable material between the active surface and the mounting surface prior to reducing the thickness of the first die.

29. The method of claim 22 wherein the first contact is electrically coupled to the third contact via a bonding wire.

30. The method of claim 22 further comprising cleaning the first die after reducing the thickness of the first die but before connecting the second die to the first die.

31. A method of assembling a stacked microelectronic device assembly from a microelectronic device subassembly, the flip chip assembly including a support and a first die attached to and electrically coupled to the support, the method comprising:
   grinding an exposed back surface of the first die, thereby reducing a thickness of the first die and leaving an electrical element exposed on the ground back surface;
   attaching an intermediate layer to the ground back surface of the first die; and
   connecting a second die to the intermediate layer and electrically coupling the second die to the exposed electrical element of the first die via the intermediate layer.

32. The method of claim 31 wherein attaching the intermediate layer to the ground back surface comprises electrically coupling a first die contact of the intermediate layer to an exposed electrical element on the ground back surface.

33. The method of claim 32 wherein electrically coupling the second die to the first die comprises electrically coupling a second die contact of the intermediate layer to a contact carried on an active surface of the second die, the first die contact being electrically coupled to the second die contact.

34. A method of assembling a microelectronic device assembly, comprising:

mechanically supporting an active surface of a first die with respect to a mounting surface of a support;

electrically coupling the first die to the support;

reducing a thickness of the first die;

after reducing the thickness of the first die, physically connecting a second die to the first die; and after physically connecting the second die to the first die, electrically coupling the second die to the support.

* * * * *

UNITED STATES PATENT AND TRADEMARK OFFICE
CERTIFICATE OF CORRECTION

PATENT NO.    : 6,548,376 B2
DATED         : April 15, 2003
INVENTOR(S)   : Jiang It is certified that error appears in the above-identified patent and that said Letters Patent is hereby corrected as shown below:

<u>Column 7,</u>
Line 27, "For example)" should be -- For example, --;
Line 46, delete "no" after "a";

<u>Column 9,</u>
Line 7, "26" should be -- 20 --;

<u>Column 11,</u>
Line 18, delete colon between "second" and "die";

Signed and Sealed this

Sixteenth Day of September, 2003

JAMES E. ROGAN
*Director of the United States Patent and Trademark Office*